(12) United States Patent
Nakaoka

(10) Patent No.: US 10,872,651 B2
(45) Date of Patent: Dec. 22, 2020

(54) VOLATILE MEMORY DEVICE AND SELF-REFRESH METHOD BY ENABLING A VOLTAGE BOOST SIGNAL

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/009,222

(22) Filed: Jun. 15, 2018

(65) Prior Publication Data

US 2019/0156881 A1 May 23, 2019

(30) Foreign Application Priority Data

Nov. 20, 2017 (JP) .................................. 2017-222389

(51) Int. Cl.
*G11C 11/406* (2006.01)
*G11C 11/408* (2006.01)

(52) U.S. Cl.
CPC .... *G11C 11/40615* (2013.01); *G11C 11/4085* (2013.01); *G11C 11/4087* (2013.01); *G11C 2211/4067* (2013.01)

(58) Field of Classification Search
CPC .......... G11C 11/40615; G11C 11/4087; G11C 11/4085; G11C 11/401–403; G11C 11/40611; G11C 11/40607; G11C 2211/4067; G11C 2211/406; G11C 13/0033; G11C 29/08; G05B 2219/34193; G09G 3/3618
See application file for complete search history.

(56) References Cited

U.S. PATENT DOCUMENTS

| | | | |
|---|---|---|---|
| 6,411,157 B1 | 6/2002 | Hsu et al. | |
| 6,643,208 B2 | 11/2003 | Yamagata et al. | |
| 7,830,732 B2 | 11/2010 | Moshayedi et al. | |
| 2003/0103368 A1* | 6/2003 | Arimoto | G11C 7/1045 365/63 |
| 2003/0235095 A1* | 12/2003 | Inoue | G11C 11/405 365/201 |
| 2013/0088921 A1* | 4/2013 | Nam | G11C 16/34 365/185.17 |

FOREIGN PATENT DOCUMENTS

TW  I430270  3/2014

OTHER PUBLICATIONS

"Office Action of Korea Counterpart Application" with English translation thereof, dated May 25, 2020, p. 1-p. 7.

* cited by examiner

*Primary Examiner* — Sultanat Begum
(74) *Attorney, Agent, or Firm* — JCIPRNET

(57) ABSTRACT

A volatile memory device and a self-refresh method thereof are provided. The volatile memory device includes a dynamic memory array. The self-refresh method includes transmit a self-refresh request signal when entering a power saving mode. A voltage boost signal is periodically enabled according to the self-refresh request signal. When the enabled voltage boost signal is detected, an operating voltage for driving a self-refresh operation is pulled up to a self-refresh level. When the operating voltage is pulled up to the self-refresh level, the dynamic memory array is self-refreshed. When the self-refresh operation is completed, the operating voltage is floated.

6 Claims, 3 Drawing Sheets

VOLATILE MEMORY DEVICE AND SELF-REFRESH METHOD BY ENABLING A VOLTAGE BOOST SIGNAL

CROSS-REFERENCE TO RELATED APPLICATION

This application claims the priority benefit of Japan application serial no. 2017-222389, filed on Nov. 20, 2017. The entirety of the above-mentioned patent application is hereby incorporated by reference herein and made a part of this specification.

BACKGROUND

Technical Field

The present disclosure relates to a memory device and a method of operating the same, and more particularly to a volatile memory device and a self-refresh method thereof

Description of Related Art

In recent years, mobile devices such as notebook computers have become more and more common. Since the service life of the battery of the mobile device is expected to be as long as possible, the power consumption of the electronic components therein needs to be as small as possible. For volatile memory (e.g., Dynamic Random Access Memory (DRAM)), in the sleep mode (e.g., S3/S4 mode regulated by Advanced Configuration and Power Interface (ACPI)), the power consumption for self-refresh must be small enough to meet the needs of mobile devices.

In prior art, many technical solutions to reduce self-refresh power consumption have been proposed. For example, in sleep mode, the level of operating voltage can be temporarily lowered (e.g., from 2.6 volts to 1.8 volts) when the self-refresh action is not in progress, and the operating voltage is not raised until the self-refresh action is to begin in order to reduce the power consumption.

However, the above existing solution is only applicable to the self-refresh method with a long time interval (for example, more than 10 milliseconds). When the time interval of self-refresh is small (for example, less than 300 microseconds), frequently decreasing and increasing the operating voltage also leads to an increase of power consumption, thereby losing the effect of effectively reducing power consumption.

SUMMARY

In view of the above, the disclosure provides a volatile memory device and a self-refresh method thereof for achieving the effect of reducing self-refresh power consumption during sleep mode by keeping operating voltage in a floating state.

The self-refresh method of the disclosure is applicable to a volatile memory device having a dynamic memory array. The self-refresh method comprises: transmitting a self-refresh request signal when entering a power saving mode; periodically enabling a voltage boost signal according to the self-refresh request signal; pulling up the operating voltage for driving the self-refresh operation to a self-refresh level when detecting that the voltage boost signal is enabled; when the operating voltage is pulled up to the self-refresh level, self-refreshing the dynamic memory array; and when the self-fresh operation is completed, floating the operating voltage.

The volatile memory device of the disclosure comprises a dynamic memory array, a controller, a refresh signal generator, a pull-up circuit, and an input/output circuit. The dynamic memory array is coupled to the controller. When entering a power saving mode, the controller transmits a self-refresh request signal. The refresh signal generator is coupled to the controller and periodically enables a voltage boost signal according to the self-refresh request signal. The pull-up circuit is coupled to the refresh signal generator, and pulls up the operating voltage for driving a self-refresh operation to a self-refresh level when the enabled voltage boost signal is detected. The input/output circuit is coupled the dynamic memory array and the controller. When the operating voltage is pulled up to the self-refresh level, the controller performs the self-refresh operation on the dynamic memory array. When the self-refresh operation is completed, the pull-up circuit floats the operating voltage.

According to the above, in a sleep mode (power-saving mode), when the self-refresh operation is completed, the self-refresh method of the disclosure would make the operating voltage in a floating state (floated) so that the operating voltage is gradually decreased. Waiting until the next self-refresh operation is started, the operating voltage is pulled up again to the level required for self-refresh operation. In this manner, not only that the operating voltage can be decreased when the self-refresh operation is not performed, there is also no additional power consumption generated due to the need to reduce and raise the operating voltage frequently.

To make the foregoing features and advantages of the present invention clearer and more comprehensible, embodiments are described below in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
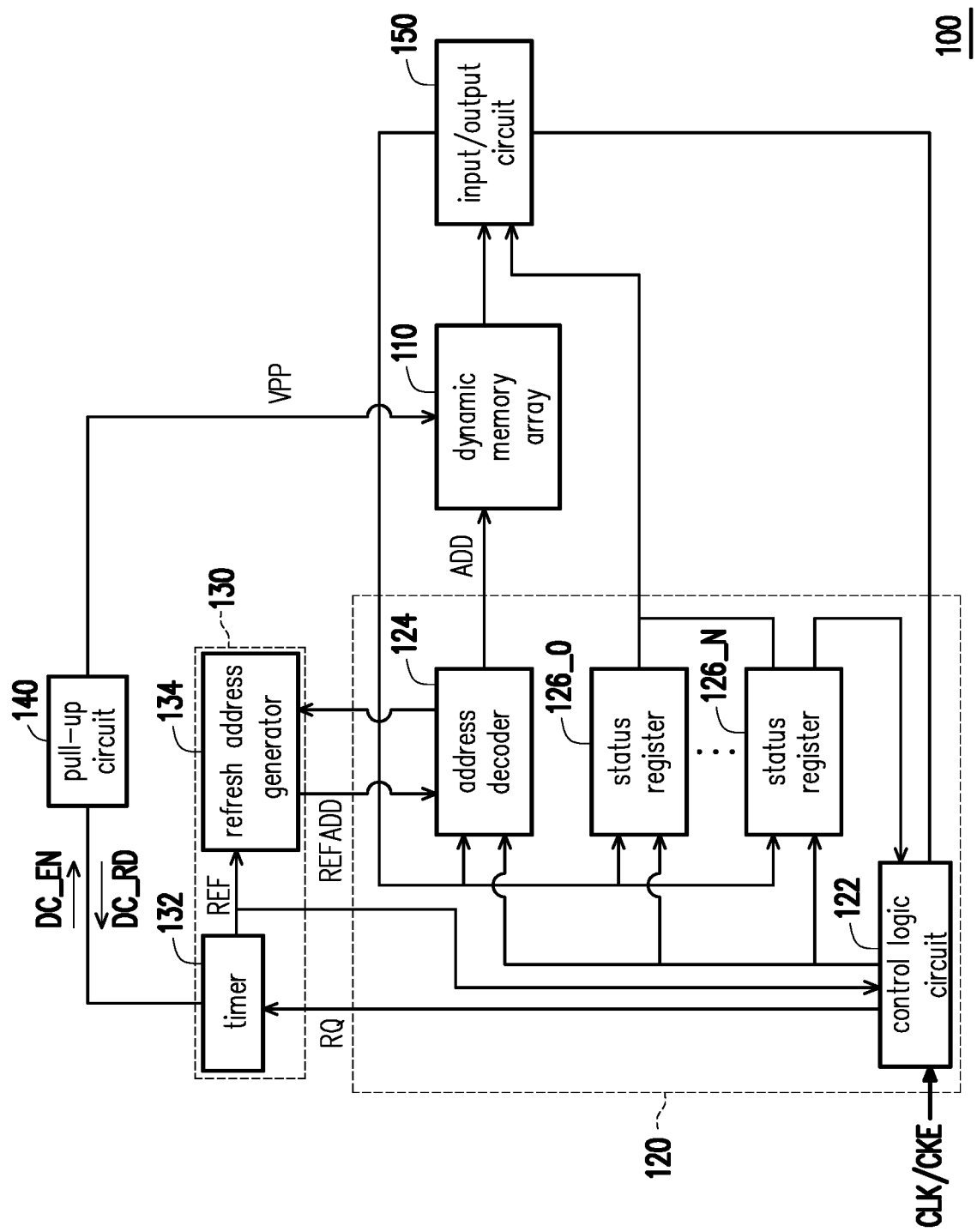
FIG. 1 is a circuit diagram illustrating a volatile memory device according to an embodiment of the disclosure.

Please refer to FIG. 1. FIG. 1 is a circuit diagram illustrating a volatile memory device according to an embodiment of disclosure. A volatile memory device 100 may be used in mobile devices such as notebook computers, tablet PCs, smart phones, personal digital assistants (PDAs), and etc. The volatile memory device 100 includes a dynamic memory array 110, a controller 120, a refresh signal generator 130, a pull-up circuit 140 and an input/output circuit 150. In this embodiment, the dynamic memory array 110 is coupled to the controller 120, and may include a plurality of memory blocks for storing written data. The controller 120 is configured to transmit a self-refresh request signal RQ. The refresh signal generator 130 is coupled to the controller 120 and is configured to periodically enable a voltage boost signal DC_EN in a sleep mode (power saving mode). The pull-up circuit 140 is coupled to the refresh signal generator 130 and configured to pull up an operating voltage VPP for driving a self-refresh operation to a self-refresh level RLV so that the volatile memory device 100 can perform a self-refresh operation in the sleep mode. The operating voltage VPP in this embodiment is in a floating state (floated) (for example, in a high impedance state) when it is not pulled up, so that the operating voltage VPP gradually decreases in level when no self-refresh operation is needed, thereby saving power consumption.

In this embodiment, the controller 120 further includes a control logic circuit 122, an address decoder 124, and a plurality of status registers 126_0-126_N (where N is a positive integer greater than or equal to 1). In this embodiment, the control logic circuit 122 is configured to receive a basic clock signal CLK and a clock enabling signal CKE provided by a signal generator (not shown). The address decoder 124 is coupled between the dynamic memory array 110 and the control logic circuit 122 for generating an address signal ADD. The status registers 126_0-126_N are coupled between the control logic circuit 122 and the address decoder 124 for storing the status information of the volatile memory device 100.

In addition, the refresh signal generator 130 further includes a timer 132 and a refresh address generator 134. In this embodiment, the timer 132 is configured to periodically enable the voltage boost signal DC_EN and generate a refresh signal REF when the operating voltage VPP is ready. The timer 132 is coupled to the refresh address generator 134. The refresh address generator 134 generates a self-refresh address REFADD according to the refresh signal REF, and provides the self-refresh address REFADD to the address decoder 124 in the controller 120. In this manner, the dynamic memory array 110 may refresh the data corresponding to the self-refresh address REFADD in the memory block.

In the present embodiment, the timer 132 may be, but is not limited to, a counting circuit that is known to have a counting function and includes an oscillator. The control logic circuit 122 may be, but not limited to, a logic circuit that utilizes a plurality of logic gates. The dynamic memory array 110 may be a conventional dynamic random access memory (DRAM), but not limited thereto. The address decoder 124, the status registers 126_0-126_N, the refresh address generator 134, the pull-up circuit 140 and the input/output circuit 150 may all be realized with the structure of application memory circuit known to those skilled in the art in the field of integrated circuit.

Figure 2:
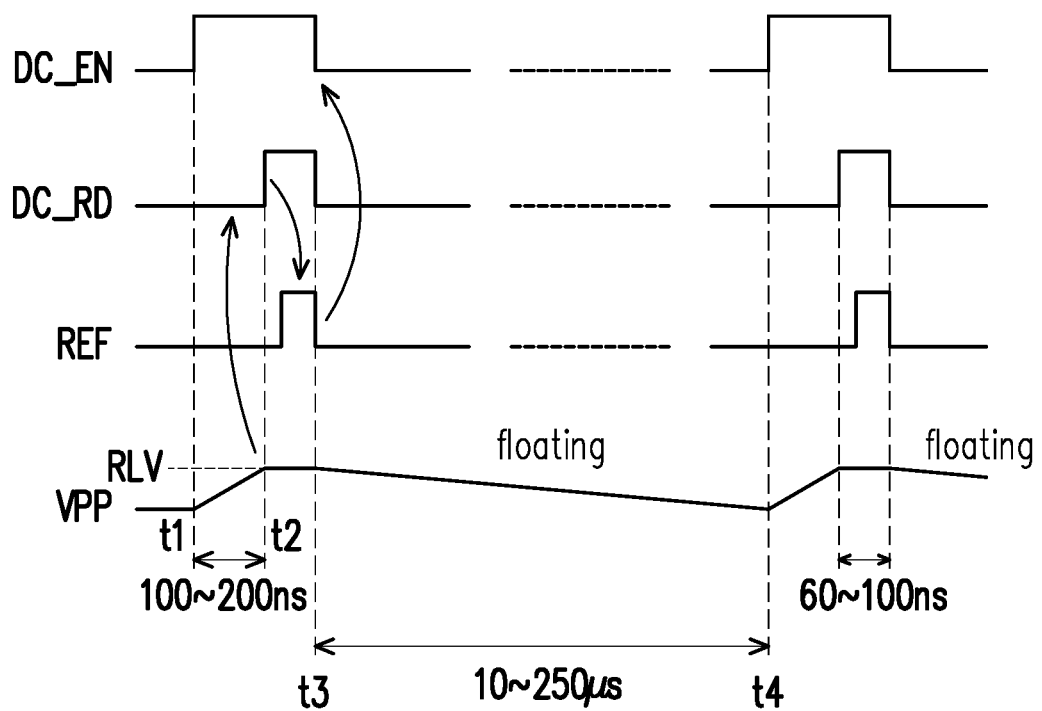
FIG. 2 is a waveform diagram illustrating a self-refresh method of a volatile memory device according to an embodiment of the disclosure.

FIG. 2 is a waveform diagram illustrating a self-refresh method of a volatile memory device according to an embodiment of the disclosure. The following describes the self-refresh method in the disclosure. Please refer to FIG. 1 and FIG. 2. For example, when not entering the sleep mode, the control logic circuit 122 may perform a general read and write operation on the dynamic memory array 110 according to the basic clock signal CLK. When the control logic circuit 122 detects that the clock enabling signal CKE is disabled, the volatile memory device 100 starts to enter the sleep mode, and the control logic circuit 122 may transmit the self-refresh request signal RQ to the timer 132.

The timer 132 that receives the self-refresh request signal RQ may start periodically enable voltage boost signal DC_EN so that the dynamic memory array 110 can periodically performs the self-refresh operation. That is, in the sleep mode, the voltage boost signal DC_EN is raised from a logic low level to a logic high level after each specific time interval (e.g., 10 microseconds to 250 microseconds). As shown in FIG. 2, the voltage boost signal DC_EN is periodically raised from the logic low level to the logic high level at times t1 and t4, respectively, to notify the pull-up circuit 140 to start pulling up the operating voltage VPP for driving the self-refresh operation.

When the pull-up circuit 140 detects that voltage boost signal DC_EN is enabled, the pull-up circuit 140 may pull up the operating voltage VPP in a floating state to the self-refresh level RLV. The self-refresh level RLV is, for example, 2.6 volts and is, for example, a voltage level for driving a word line in the dynamic memory array 110.

The time interval for pulling the operating voltage VPP up to the self-refresh level RLV is, for example, 100 nanoseconds to 200 nanoseconds. The pull-up circuit 140 may, for example, transmit the operating voltage VPP which is pulled up to the self-refresh level RLV to a word-line driver (not shown) in the dynamic memory array 110 to drive the dynamic memory array 110 to perform the self-refresh operation.

At time t2, after the pull-up circuit 140 pulls the operating voltage VPP up to the self-refresh level RLV, the pull-up circuit 140 may enable a voltage ready signal DC_RD to notify the refresh signal generator 130 that the operating voltage VPP has reached the self-refresh level RLV and the self-refresh operation may begin to be performed. Therefore, when the timer 132 detects that the voltage ready signal DC_RD is enabled, the refresh signal REF (rising from the low logic level to the high logic level) may be generated to the refresh address generator 134.

The refresh address generator 134 may generate the self-refresh address REFADD according to the refresh signal REF and provide the self-refresh address REFADD to the address decoder 124 in the controller 120. The address decoder 124 may generate the address signal ADD to the dynamic memory array 110 according to the self-refresh address REFADD (e.g., decoding). Therefore, the dynamic memory array 110 is driven by the operating voltage VPP to refresh the data corresponding to the self-refresh address REFADD in the memory block to complete the self-refresh operation.

At the time t3, after the current self-refresh operation is completed (the refresh signal REF is decreased from the high logic level to the low logic level), the timer 132 may disable the voltage boost signal DC_EN. The pull-up circuit 140, which detects the disabled voltage boost signal DC_EN, again floats the operating voltage VPP and disables the voltage ready signal DC_RD to wait for the next self-refresh operation to begin at time t4.

Between time t3 and time t4, the level of the operating voltage VPP in the floating state gradually decreases, so that the effect of reducing power consumption is achieved.

It should be noted that, as shown in FIG. 2, in this embodiment, the voltage boost signal DC_EN, the voltage ready signal DC_RD, and the refresh signal REF are all high active signals, that is, the above signals are logic high level when they are in the enabled state. Certainly, in other embodiments of the disclosure, the above signals may also be a low active signals; the disclosure provides no limitation thereto.

Figure 3:
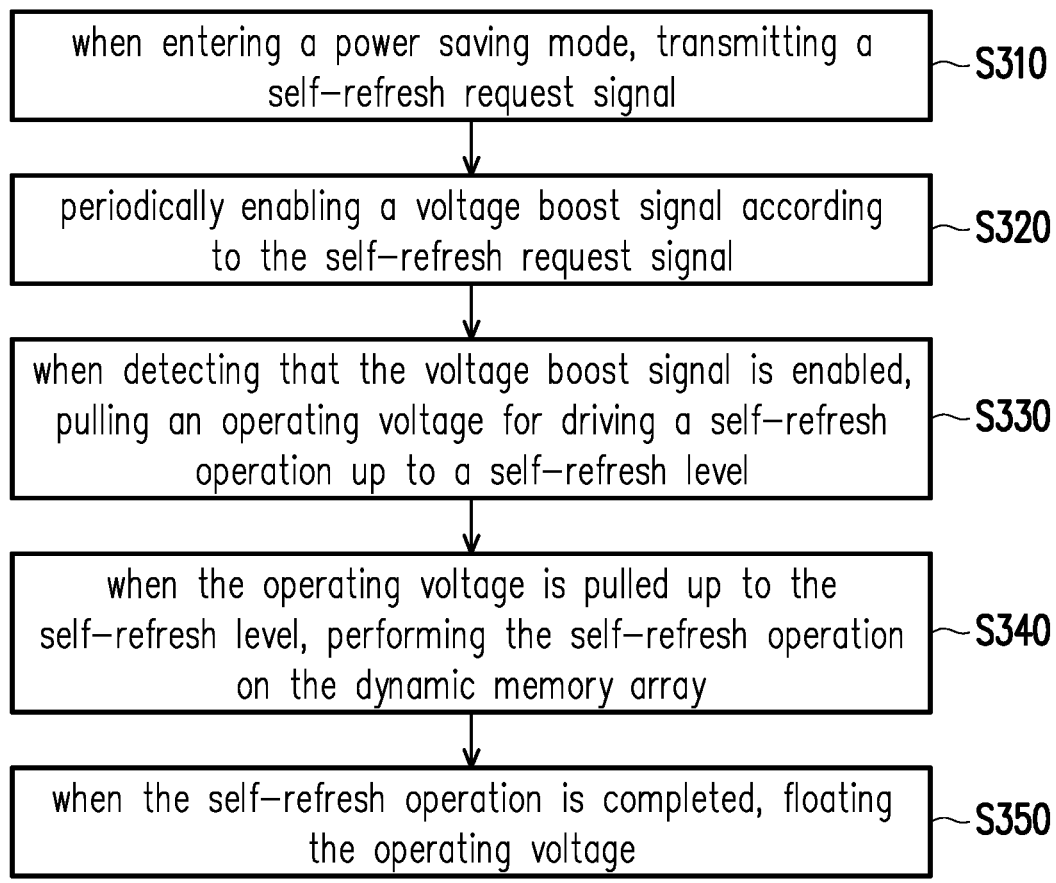
FIG. 3 is a flowchart illustrating a self-refresh method of a volatile memory device according to an embodiment of the disclosure.

FIG. 3 is a flowchart illustrating a self-refresh method of a volatile memory device according to an embodiment of the disclosure. Referring to both FIG. 1 and FIG. 3, in step S310, when entering the power saving mode, the controller 120 transmits the self-refresh request RQ. In step S320, the refresh signal generator 130 periodically enables the voltage boost signal DC_EN according to the self-refresh request signal RQ. In step S330, when it is detected that the voltage boost signal DC_EN is enabled, the pull-up circuit 140 pulls the operating voltage VPP for driving the self-refresh operation up to the self-refresh level RLV. In step S340, after the operating voltage VPP is pulled up to the self-refresh level RLV, the controller 120 performs the self-refresh operation on the memory array 110. In step S350, when the self-refresh operation is completed, the pull-up circuit 140 floats the operating voltage VPP. The implementation of each step are described in details in the foregoing embodiments and implementation methods, and no further descriptions are incorporated below.

In summary, the self-refresh method of the disclosure brings the operating voltage to a floating state (floated) to gradually decrease the operating voltage after the self-refresh operation is completed, and wait for the next self-refresh operation to begin to pull up the operating voltage to the level required for self-refresh operation. In this way, in the operating mode of frequent self-refresh (with a short refresh interval), the power consumption caused by frequent reduction and increase of operating voltage can be greatly reduced, and the energy-saving requirement of the mobile device can be satisfied.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A self-refresh method, adapted to a volatile memory device having a dynamic memory array, comprising:
   when entering a power saving mode, transmitting a self-refresh request signal;
   receiving a basic clock signal and a clock enabling signal by a control logic circuit;
   generating an address signal by an address decoder;
   storing a status information of the volatile memory device by a plurality of status registers,
   wherein the status registers are directly coupled to the control logic circuit and the address decoder;
   periodically enabling a voltage boost signal according to the self-refresh request signal;
   when detecting, by a pull-up circuit, that the voltage boost signal is enabled, pulling an operating voltage by the pull-up circuit for driving a word line in the dynamic memory array up to a self-refresh level;
   when the operating voltage is pulled up to the self-refresh level, performing a self-refresh operation on the dynamic memory array; and
   when the self-refresh operation is completed, floating the operating voltage, and disabling the voltage boost signal, wherein
   after pulling the operating voltage up to the self-refresh level, enabling a voltage ready signal by the pull-up circuit to notify that the operating voltage has reached the self-refresh level,
   after the self-refresh operation is completed, the voltage ready signal is disabled by the pull-up circuit to wait for next self-refresh operation.

2. The self-refresh method as claimed in claim 1, wherein after the step of pulling the operating voltage for driving the word line in the dynamic memory array to the self-refresh level, the method further comprising:
   enabling a voltage ready signal to notify that the self-refresh operation can begin to be performed.

3. The self-refresh method as claimed in claim 2, wherein the step of performing the self-refresh operation on the dynamic memory array comprises:
   when detecting that the voltage ready signal is enabled, generating a refresh signal;
   generating a self-refresh address according to the refresh signal; and
   refreshing data corresponding to the self-refresh address in the dynamic memory array.

4. A volatile memory device, comprising:
   a dynamic memory array;
   a controller, coupled to the dynamic memory array, transmitting a self-refresh request signal when entering a power saving mode, wherein the controller comprises:
      a control logic circuit, receiving a basic clock signal and a clock enabling signal;
      an address decoder, coupled to the control logic circuit and the dynamic memory array to generate an address signal; and
      a plurality of status registers, directly coupled to the address decoder and the control logic circuit to store a status information of the volatile memory device;
   a refresh signal generator, coupled to the controller, periodically enabling a voltage boost signal according to the self-refresh request signal;
   a pull-up circuit, coupled to the refresh signal generator and the dynamic memory array, when the enabled voltage boost signal is detected, pulling up an operating voltage for driving a word line in the dynamic memory array to a self-refresh level; and
   an input/output circuit, coupled to the dynamic memory array and the controller,
   wherein, when the operating voltage is pulled up to the self-refresh level, the controller performs the self-refresh operation on the dynamic memory array,
   when the self-refresh operation is completed, the pull-up circuit floats the operating voltage,
   wherein when the self-refresh operation is completed, the refresh signal generator disables the voltage boost signal,
   wherein after pulling the operating voltage up to the self-refresh level, the pull-up circuit enables a voltage ready signal to notify that the operating voltage has reached the self-refresh level,
   wherein after the self-refresh operation is completed, the pull-up circuit disables the voltage ready signal to wait for next self-refresh operation.

5. The volatile memory device as claimed in claim 4, wherein after the pull-up circuit pulls up the operating voltage to the self-refresh level, the pull-up circuit enables a voltage ready signal to notify the refresh signal generator that the self-refresh operation can begin to be performed.

6. The volatile memory device as claimed in claim 5, wherein the refresh signal generator comprises:
   a timer, generating a refresh signal when it is detected that the voltage ready signal is enabled; and
   a refresh address generator, generating a self-refresh address according to the refresh signal and providing the self-refresh address to the controller to refresh data corresponding to the self-refresh address in the dynamic memory array.

\* \* \* \* \*